United States Patent
Nakaoka

(10) Patent No.: US 10,825,546 B2
(45) Date of Patent: Nov. 3, 2020

(54) MEMORY DEVICE AND MEMORY PERIPHERAL CIRCUIT

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/516,257

(22) Filed: Jul. 19, 2019

(65) Prior Publication Data

US 2020/0027522 A1 Jan. 23, 2020

(30) Foreign Application Priority Data

Jul. 19, 2018 (JP) .................................. 2018-135449

(51) Int. Cl.
  *G11C 29/00* (2006.01)
  *G11C 29/44* (2006.01)

(52) U.S. Cl.
  CPC ............ *G11C 29/765* (2013.01); *G11C 29/44* (2013.01)

(58) Field of Classification Search
  CPC .............................. G11C 29/765; G11C 29/44
  See application file for complete search history.

(56) References Cited

U.S. PATENT DOCUMENTS

| | | | |
|---|---|---|---|
| 5,544,106 A | 8/1996 | Koike | |
| 5,801,986 A | 9/1998 | Matsumoto et al. | |
| 5,859,801 A | 1/1999 | Poechmueller | |
| 6,144,592 A | 11/2000 | Kanda | |
| 7,362,630 B2 | 4/2008 | Mori et al. | |
| 9,633,750 B2 | 4/2017 | Park et al. | |

(Continued)

FOREIGN PATENT DOCUMENTS

| | | |
|---|---|---|
| CN | 1241000 | 1/2000 |
| JP | H01273298 | 11/1989 |

(Continued)

OTHER PUBLICATIONS

"Office Action of Japan Counterpart Application," dated Sep. 24, 2019, p. 1-p. 6.

(Continued)

*Primary Examiner* — Gene N Auduong
(74) *Attorney, Agent, or Firm* — JCIPRNET

(57) ABSTRACT

A memory device and a memory peripheral circuit are provided. The memory peripheral circuit includes a redundancy column data circuit and a column selection control circuit. The redundancy column data circuit is configured to provide a redundancy test mode data signal and a column address signal. The column address signal includes a redundancy column address signal. The column selection control circuit includes a column decoder and a redundancy column decoder. The column decoder disables a bad column address of a main memory block according to the redundancy test mode data signal and the redundancy column address signal. The redundancy column decoder latches the redundancy column address signal, compares the column address signal with the latched redundancy column address to obtain a comparison result, and enables a redundancy column address of a redundancy memory block according to the comparison result.

20 Claims, 13 Drawing Sheets

(56) References Cited

U.S. PATENT DOCUMENTS

| | | | |
|---|---|---|---|
| 9,818,470 B2* | 11/2017 | Best | .................. H01L 25/18 |
| 2004/0120178 A1 | 6/2004 | Jang | |
| 2012/0327724 A1 | 12/2012 | Kawakubo | |
| 2013/0215696 A1* | 8/2013 | Choi | .................. G11C 29/028 |
| | | | 365/201 |
| 2016/0042809 A1* | 2/2016 | Kim | .................. G11C 29/52 |
| | | | 714/719 |
| 2016/0155515 A1* | 6/2016 | Son | .................. G11C 29/4401 |
| | | | 714/719 |
| 2019/0221249 A1* | 7/2019 | Best | .................. G11C 11/406 |

FOREIGN PATENT DOCUMENTS

| | | |
|---|---|---|
| JP | H0628891 | 2/1994 |
| JP | H0636594 | 2/1994 |
| JP | H0660693 | 3/1994 |
| JP | H07226100 | 8/1995 |
| JP | H0935493 | 2/1997 |
| JP | H11144492 | 5/1999 |
| JP | H11353894 | 12/1999 |
| JP | 2000113697 | 4/2000 |
| JP | 2004288286 | 10/2004 |
| JP | 2007012128 | 1/2007 |
| JP | 2013008426 | 1/2013 |
| KR | 10-0675295 | 1/2007 |
| TW | 200419583 | 10/2004 |

OTHER PUBLICATIONS

"Office Action of Korea Counterpart Application" with English translation thereof, dated Nov. 18, 2019, p. 1-p. 10.

* cited by examiner

MEMORY DEVICE AND MEMORY PERIPHERAL CIRCUIT

CROSS-REFERENCE TO RELATED APPLICATION

This application claims the priority benefit of Japan application serial no. 2018-135449, filed on Jul. 19, 2018. The entirety of the above-mentioned patent application is hereby incorporated by reference herein and made a part of this specification.

BACKGROUND OF THE DISCLOSURE

1. Field of the Disclosure

The disclosure relates to a memory device and a memory peripheral circuit, and more particularly, to a memory device and a memory peripheral circuit for replacing a bad column address with a redundancy column address.

2. Description of Related Art

In a redundancy column operation of a general memory device, a metal fuse may be disposed in each column decoder to disable the bad column address by turning on or burning out the metal fuse. However, once the metal fuse is burned out or turned on, the state before the redundancy column operation cannot be restored. In addition, it is difficult to apply the metal fuse in miniaturized memory devices due to a larger space required for disposition.

SUMMARY OF THE DISCLOSURE

The disclosure provides a memory device and a memory peripheral circuit. The memory peripheral circuit of the memory device is configured to disable a bad column address of the memory device as a replacement of the conventional metal fuse.

The memory peripheral circuit of the disclosure is coupled to a memory array. The memory peripheral circuit includes a redundancy column data circuit and a column selection control circuit. The redundancy column data circuit stores redundancy column information, and provides a redundancy test mode data signal and a column address signal according to the redundancy column information. The column address signal includes a redundancy column address signal. The column selection control circuit is coupled between the redundancy column data circuit and the memory array. The column selection control circuit receives the redundancy test mode data signal and the column address signal, and the column selection control circuit includes a column decoder and a redundancy column decoder. The column decoder is coupled between a main memory block of the memory array and the redundancy column data circuit. The column decoder disables a bad column address of a main memory block according to the redundancy test mode data signal and the redundancy column address signal. The redundancy column decoder is coupled between a redundancy memory block of the memory array and the redundancy column data circuit. The redundancy column decoder latches the redundancy column address signal according to the redundancy test mode data signal, compares the column address signal with the latched redundancy column address to obtain a comparison result, and enables a redundancy column address of the redundancy memory block according to the comparison result.

The memory device of the disclosure includes a memory array and the memory peripheral circuit mentioned above. The memory array includes a main memory block and a redundancy memory block.

Based on the above, the memory peripheral circuit of the memory device of the disclosure can disable the bad column address of the main memory block according to the redundancy test mode data signal and the column address signal and enable the redundancy column address of the redundancy memory block. In this way, the memory peripheral circuit can replace the decoder and the metal fuse so the layout space may be the reduced for the peripheral circuit and the state before the redundancy column operation may be restored.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
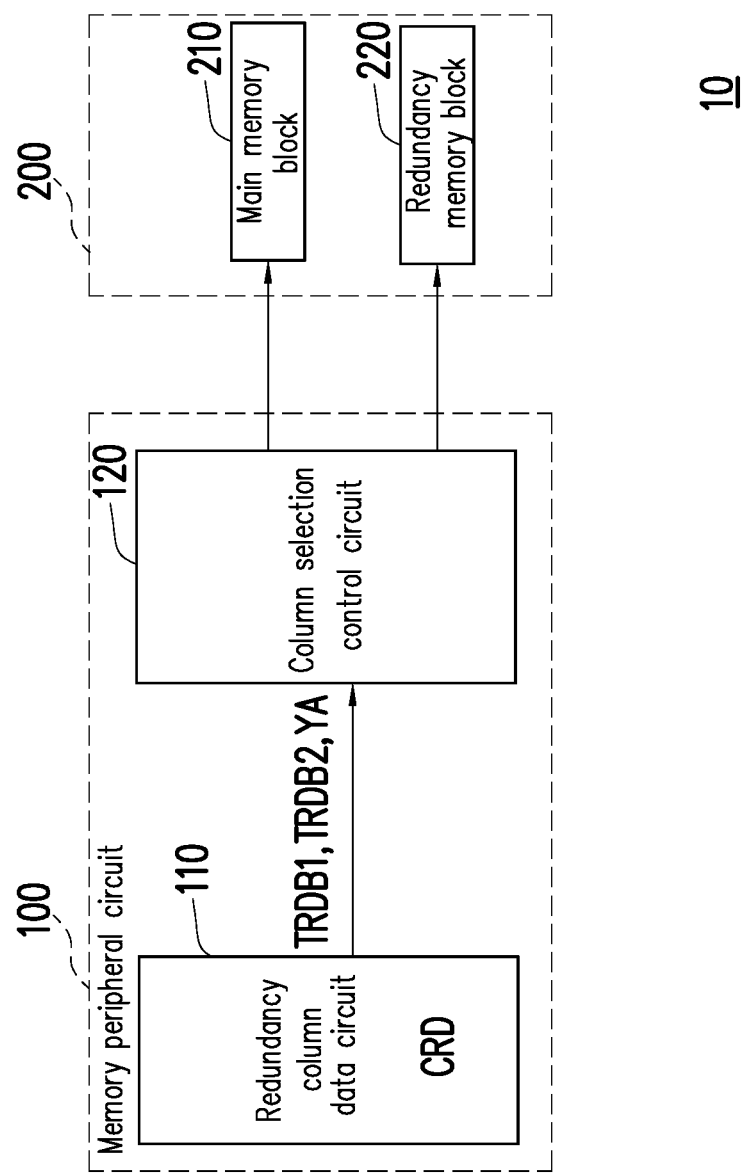
FIG. 1 is a schematic diagram of a memory device in an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

With reference to FIG. 1, a memory device 10 includes a memory peripheral circuit 100 and a memory array 200. The memory peripheral circuit 100 includes a redundancy column data circuit 110 and a column selection control circuit 120. The memory array 200 includes a main memory block 210 and a redundancy memory block 220. The redundancy column data circuit 110 is configured to store redundancy column information CRD. The redundancy column information CRD records a bad column address of the main memory block 210 detected during a test stage. The redundancy column data circuit 110 provides redundancy test mode data signals TRDB1 and TRDB2 and a column address signal YA to the column selection control circuit 120 according to the redundancy column information CRD. The column address signal YA includes a redundancy column address signal, which corresponds to the column address signal YA of the redundancy column address signals TRDB1 and TRDB2. The column selection control circuit 120 is coupled between the redundancy column data circuit 110 and the memory array 200. The column selection control circuit 120 disables the bad column address of the main memory block 210 according to the redundancy test mode data signals TRDB1 and TRDB2 and the redundancy column address signal of the column address signal YA, and enables a redundancy column address of the redundancy memory block 220.

Figure 2:
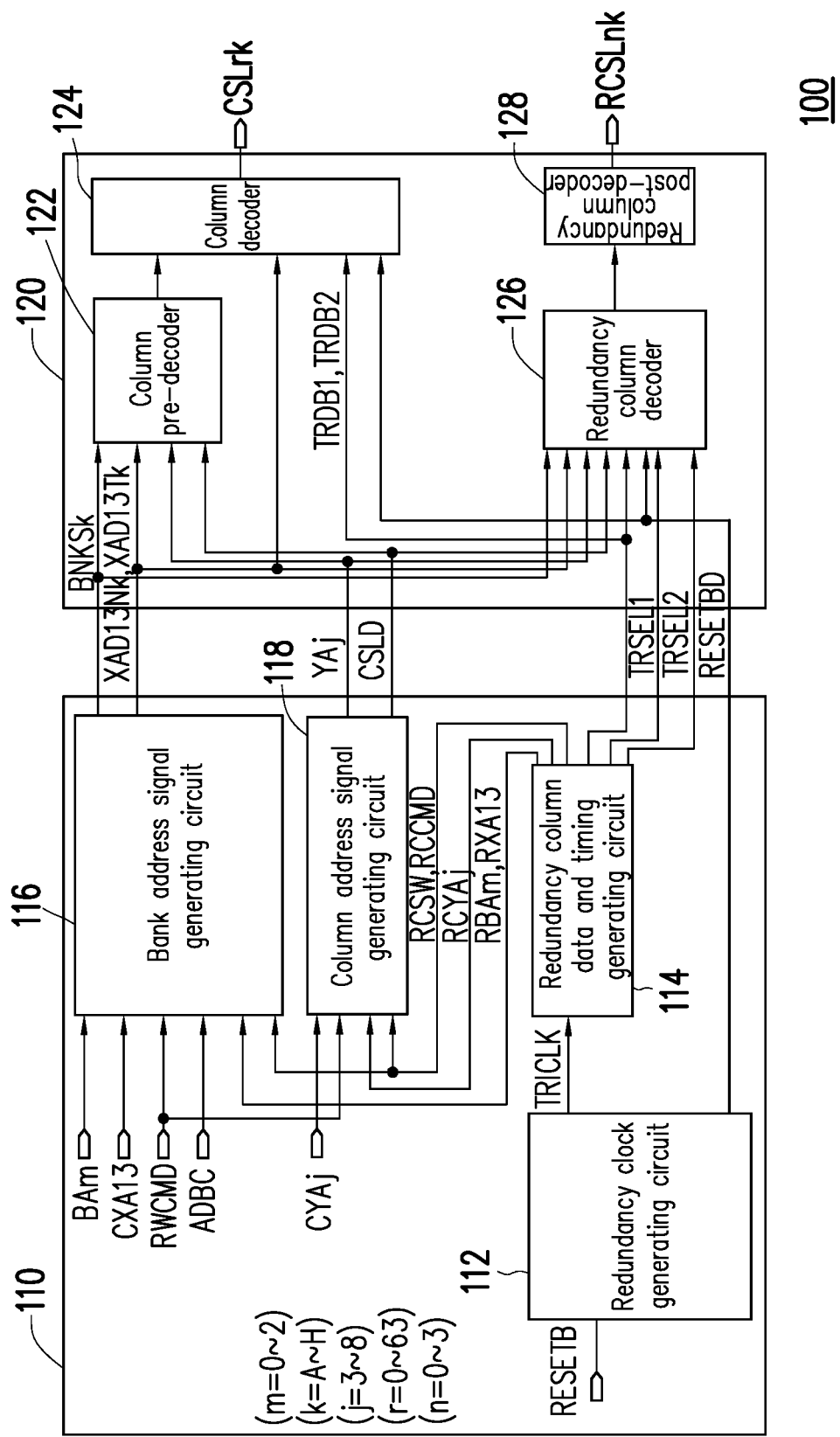
FIG. 2 is a schematic diagram of a memory peripheral circuit in the embodiment of FIG. 1.

With reference to FIG. 2, the redundancy column data circuit 110 includes a redundancy clock generating circuit 112, a redundancy column data and timing generating circuit 114, a bank address signal generating circuit 116 and a column address signal generating circuit 118. The column selection control circuit 120 includes a column pre-decoder 122, a column decoder 124, a redundancy column decoder 126, and a redundancy column post-decoder 128. The column pre-decoder 122 is coupled between the redundancy column data circuit 110 and the column decoder 124. The redundancy clock generating circuit 112 is configured to receive a global reset signal RESETB and provide a redundancy test clock TRICLK to the redundancy column data and timing generating circuit 114. The redundancy clock generating circuit 112 is further configured to provide a local reset signal RESETBD to the column selection control circuit 120. The column selection control circuit 120 is configured to reset the column decoder 124 and the redundancy column decoder 126 according to a first logic level of the local reset signal RESETBD, such that the column decoder 124 and the redundancy column decoder 126 can be restored to the state before the redundancy column operation. The column selection control circuit 120 is further configured to initialize the column decoder 124 and the redundancy column decoder 126 according to a transition point of the local reset signal RESETBD so the column decoder 124 and the redundancy column decoder 126 start to perform the redundancy column operation.

The redundancy column data and timing generating circuit 114 is coupled to the redundancy clock generating circuit 112, the bank address signal generating circuit 116, the column address signal generating circuit 118 and the column selection control circuit 120. The redundancy column data and timing generating circuit 114 is configured to store redundancy column information, and provide a redundancy block address signal RXA13, a redundancy bank address signal RBAm, a redundancy switch signal RCSW and a redundancy mode command RCCMD corresponding to the redundancy column information to the bank address signal generating circuit 116 according to the redundancy test clock TRICLK. The redundancy column data and timing generating circuit 114 provides a redundancy column address signal RCYAj, the redundancy switch signal RCSW and the redundancy mode command RCCMD to the column address signal generating circuit 118 according to the redundancy test clock TRICLK.

The bank address signal generating circuit 116 receives the redundancy block address signal RXA13, the redundancy bank address signal RBAm, the redundancy switch signal RCSW and the redundancy mode command RCCMD, and provides a bank selection signal BNKSk and block selection signals XAD13Nk and XAD13Tk according to a bank address signal BAm, a block address signal CXA13, a read/write command RWCMD and an address buffer control signal ADBC.

The column address signal generating circuit 118 receives a read/write column address signal CYAj, the redundancy column address signal RCYAj, the redundancy switch signal RCSW, the read/write command RWCMD and the redundancy mode command RCCMD, and thereby generate a column address signal YAj and a column selection driving signal CSLD.

In the embodiment of FIG. 2, the column pre-decoder 122 is configured to decode the column address signal YAj. The column decoder 124 is coupled between the redundancy column data circuit 110 and the main memory block 210. The column decoder 124 can select a column address CSLrk in the main memory block according to the column address signal YAj. The column decoder 124 further disables the bad column address of the main memory block 210 according to the redundancy test mode data signals TRDB1 and TRDB2 and the redundancy column address signal RCYAj in the column address signal YAj. The redundancy column decoder 126 is coupled between the redundancy column data circuit 110 and the redundancy column post-decoder 128. The redundancy column decoder 126 is configured to latch the redundancy column address signal RCYAj according to the redundancy test mode data signals TRDB1 and TRDB2, compare the column address signal YAj with the latched redundancy column address RCYAj to obtain a comparison result and enable a redundancy column address RCSLnk of the redundancy memory block 220 according to the comparison result. The redundancy column post-decoder 128 is configured to select the redundancy column address RCSLnk corresponding to the redundancy column address signal RCYAj according to the redundancy column address signal RCYAj provided by the redundancy column decoder 126. In this embodiment, m is equal to 0 to 2; k is equal to A to H; j is equal to 3 to 8; r is equal to 0 to 36, and n is equal to 0 to 3. However, the disclosure is not limited in this regard.

Figure 3:
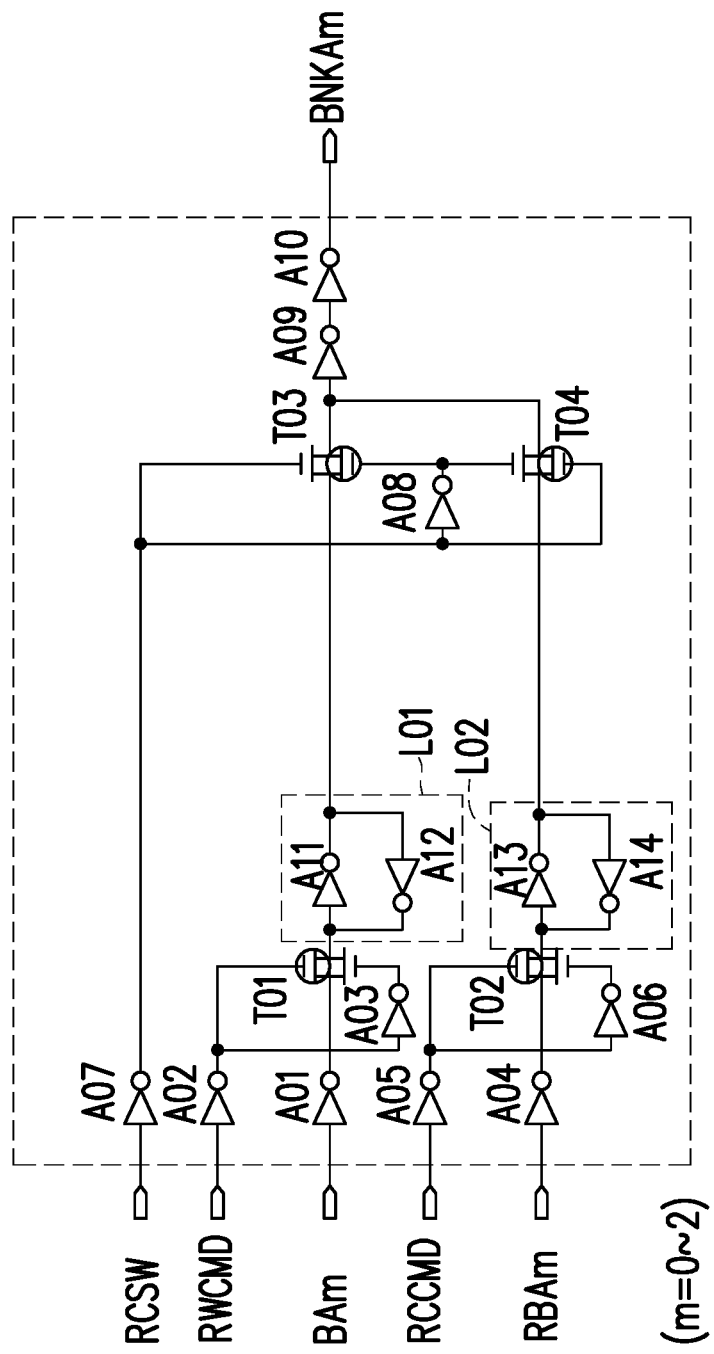
FIG. 3 is a schematic diagram of a bank address signal buffer in an embodiment of the disclosure.

Further, the bank address signal generating circuit 116 further includes a bank address signal buffer 1162, a bank address signal selector 1164 and a block address signal buffer and selector 1166. With reference to FIG. 3, the bank address signal buffer 1162 includes inverters A01 to A10, transmission gates T01 to T04 and latch circuits L01 and L02. An input end of the inverter A01 is configured to receive the bank address signal BAm. An output end of the inverter A01 is coupled to an input end of the transmission gate T01. An input end of the inverter A02 is configured to receive the read/write command RWCMD. An output end of the inverter A02 is coupled to a P-channel gate of the transmission gate T01 and an input end of the inverter A03. An output end of the inverter A03 is coupled to an N-channel gate of the transmission gate T01. An output end of the transmission gate T01 is coupled to an input end of the latch circuit L01. An input end of the inverter A04 is configured to receive the redundancy bank address signal RBAm. An output end of the inverter A04 is coupled to an input end of the transmission gate T02. An input end of the inverter A05 is configured to receive the redundancy mode command RCCMD. An output end of the inverter A05 is coupled to a P-channel gate of the transmission gate T02 and an input end of the inverter A06. An output end of the inverter A06 is coupled to an N-channel gate of the transmission gate T02. An output end of the transmission gate T02 is coupled to an input end of the latch circuit L02. An input end of the inverter A07 is configured to receive the redundancy switch signal RCSW. An output end of the inverter A07 is coupled to an N-channel gate of the transmission gate T03, an input end of the inverter A08 and a P-channel gate of the transmission gate T04. An output end of the inverter A08 is coupled to a P-channel gate of the transmission gate T03 and an N-channel gate of the transmission gate T04. An output end of the latch circuit L01 is coupled to an input end of the transmission gate T03. An output end of the latch circuit L02 is coupled to an input end of the transmission gate T04. The latch circuit L01 includes inverters A1 and A12. An input end of the inverter A11 is coupled to an output end of the inverter A12 and the output end of the transmission gate T01. An output end of the inverter A11 is coupled to an input end of the inverter A12 and the input end of the transmission gate T03. The latch circuit L02 includes inverters A13 and A14. An input end of the inverter A13 is coupled to an output end of the inverter A14 and the output end of the transmission gate T02. An output end of the inverter A13 is coupled to an input end of the inverter A14 and the input end of the transmission gate T04. Output ends of the transmission gates T03 and T04 are configured to output a selected bank address signal BNKAm through the inverters A09 and A10. In this embodiment, m is equal to 0 to 2.

In the embodiment of FIG. 3, the transmission gate T01 is controlled by the read/write command RWCMD, and the transmission gate T02 is controlled by the redundancy mode command RCCMD. When the bank address signal buffer 1162 receives the read/write command RWCMD in high logic level, the bank address signal buffer 1162 can latch the bank address signal BAm corresponding to the read/write command RWCMD in the latch circuit L01. When the bank address signal buffer 1162 receives the redundancy mode command RCCMD in high logic level, the bank address signal buffer 1162 can latch the redundancy bank address signal RBAm corresponding to the redundancy mode command RCCMD in the latch circuit L02. The transmission gates T03 and T04 are controlled by the redundancy switch signal RCSW. When receiving the redundancy switch signal RCSW in low logic level, the bank address signal buffer 1162 uses the bank address signal BAm latched in the latch circuit L01 as the selected bank address signal BNKAm, and outputs the selected bank address signal BNKAm through a path from the transmission gate T03 to the inverters A09 and A10. Conversely, when receiving the redundancy switch signal RCSW in high logic level, the bank address signal buffer 1162 uses the redundancy bank address signal RBAm latched in the latch circuit L02 as the selected bank address signal BNKAm, and outputs the selected bank address signal BNKAm through a path from the transmission gate T04 to the inverters A09 and A10.

Figure 4:
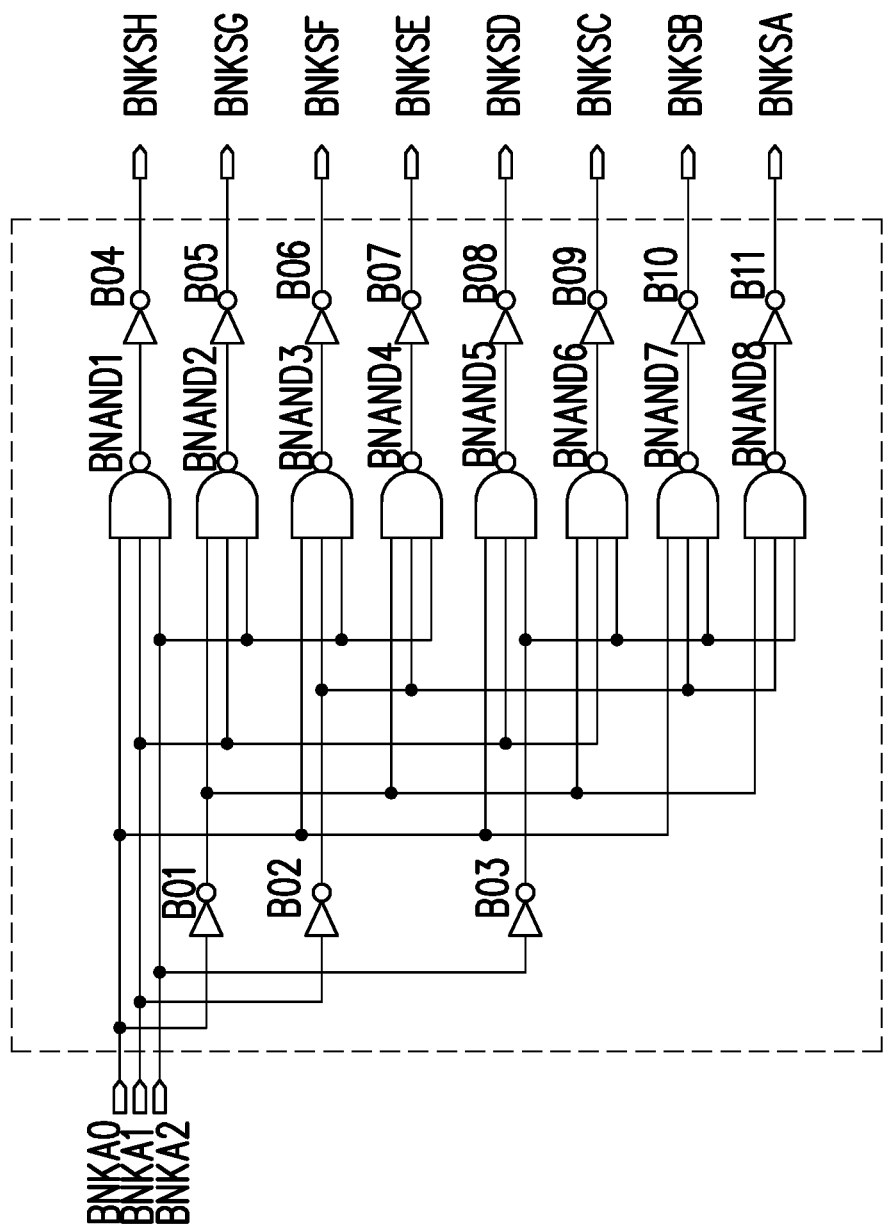
FIG. 4 is a schematic diagram of a bank address signal selector in an embodiment of the disclosure.

With reference to FIG. 4, the bank address signal selector 1164 is configured to receive selected bank address signals BNKA0 to BNKA2 and generate the bank selection signal BNKSk according to the selected bank address signals BNKA0 to BNKA2. In this embodiment, the bank address signal selector 1164 may be implemented by a demultiplexer. The bank address signal selector 1164 includes inverters B01 to B11 and NAND gates BNAND1 to BNAND8.

A plurality of input ends of the NAND gate BNAND1 receive the selected bank address signals BNKA0 to BNKA2, respectively. An output end of the NAND gate BNAND1 is coupled to an input end of the inverter B04. An output end of the inverter B04 is configured to output a bank selection signal BNKSH. The NAND gate BNAND2 receives the selected bank address signals BNKA1 to BNKA2, and is coupled to an output end of the inverter B01 to receive the inversed bank address signal BNAK0. An output end of the NAND gate BNAND2 is coupled to an input end of the inverter B05. An output end of the inverter B05 is configured to output a bank selection signal BNKSG, and configuration for the rest of components may be deduced from the above.

Figure 5:
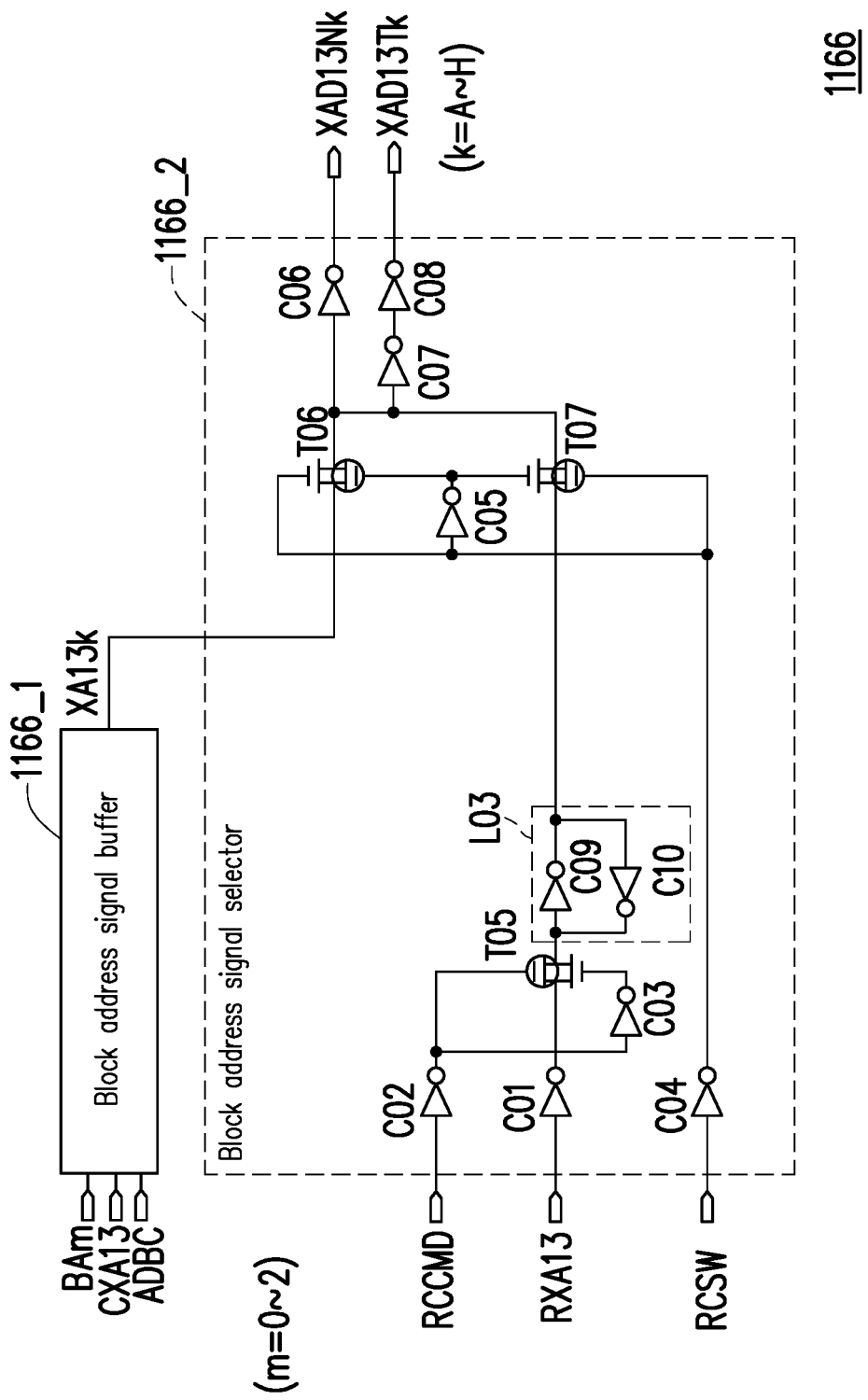
FIG. 5 is a schematic diagram of a block address signal buffer and selector in an embodiment of the disclosure.

With reference to FIG. 5, the bank address signal buffer and selector 1166 includes a block address signal buffer 1166_1 and a block address signal selector 1166_2. The block address signal buffer 1166_1 is configured to receive the bank address signal BAm, the block address signal CXA13, the address buffer control signal ADBC and thereby generate a block selection signal XA13k corresponding to the bank address signal BAm.

The block address signal selector 1166_2 includes inverters C01 to C08, transmission gates T05 to T07 and a latch circuit L03. An input end of the inverter C01 is configured to receive the redundancy block address signal RXA13. An output end of the inverter C01 is coupled to an input end of the transmission gate T05. An input end of the inverter C02 is configured to receive the redundancy mode command RCCMD. An output end of the inverter C02 is coupled to a P-channel gate of the transmission gate T05 and an input end of the inverter C03. An output end of the inverter C03 is coupled to an N-channel gate of the transmission gate T05. An output end of the transmission gate T05 is coupled to an input end of the latch circuit L03. An input end of the inverter C04 is configured to receive the redundancy switch signal RCSW. An output end of the inverter C04 is coupled to an N-channel gate of the transmission gate T06, an input end of the inverter C05 and a P-channel gate of the transmission gate T07. An output end of the inverter C05 is coupled to a P-channel gate of the transmission gate T06 and an N-channel gate of the transmission gate T07. An input end of the transmission gate T06 is configured to receive the block selection signal XA13k provided by the block address signal buffer 1166_1. An input end of the transmission gate T07 is coupled to an output end of the latch circuit L03. Output ends of the transmission gates T06 and T07 are coupled to the inverters C06 and C07. Here, the block selection signal XAD13Nk is output through the inverter C06, and the block selection signal XAD13Tk is output through the inverters C07 and C08. Logic levels of the block selection signals XAD13Nk and XAD13Tk are opposite to each other. The latch circuit L03 includes inverters C09 and C10. An input end of the inverter C09 is coupled to an output end of the inverter C10 and the output end of the transmission gate T05. An output end of the inverter C09 is coupled to an input end of the inverter C10 and the input end of the transmission gate T07.

In the embodiment of FIG. 5, the transmission gate T05 is controlled by the redundancy mode command RCCMD. When the block address signal selector 1166_2 receives the redundancy mode command RCCMD in high logic level, the block address signal selector 1166_2 can latch the redundancy block address signal RXA13 corresponding to the redundancy mode command RCCMD in the latch circuit L03. The transmission gates T06 and T07 are controlled by the redundancy switch signal RCSW. When receiving the redundancy switch signal RCSW in low logic level, the block address signal selector 1166_2 uses the block selection signal XA13k provided by the block address signal buffer 1166_1 as the block selection signals XAD13Nk and XAD13Tk and outputs the block selection signals XAD13Nk and XAD13Tk through a path from the transmission gate T06. Conversely, when receiving the redundancy switch signal RCSW in high logic level, the block address signal selector 1166_2 uses the redundancy block address signal RXA13 latched in the latch circuit L03 as the block selection signals XAD13Nk and XAD13Tk and outputs the block selection signals XAD13Nk and XAD13Tk through a path from the transmission gate T07.

Figure 6:
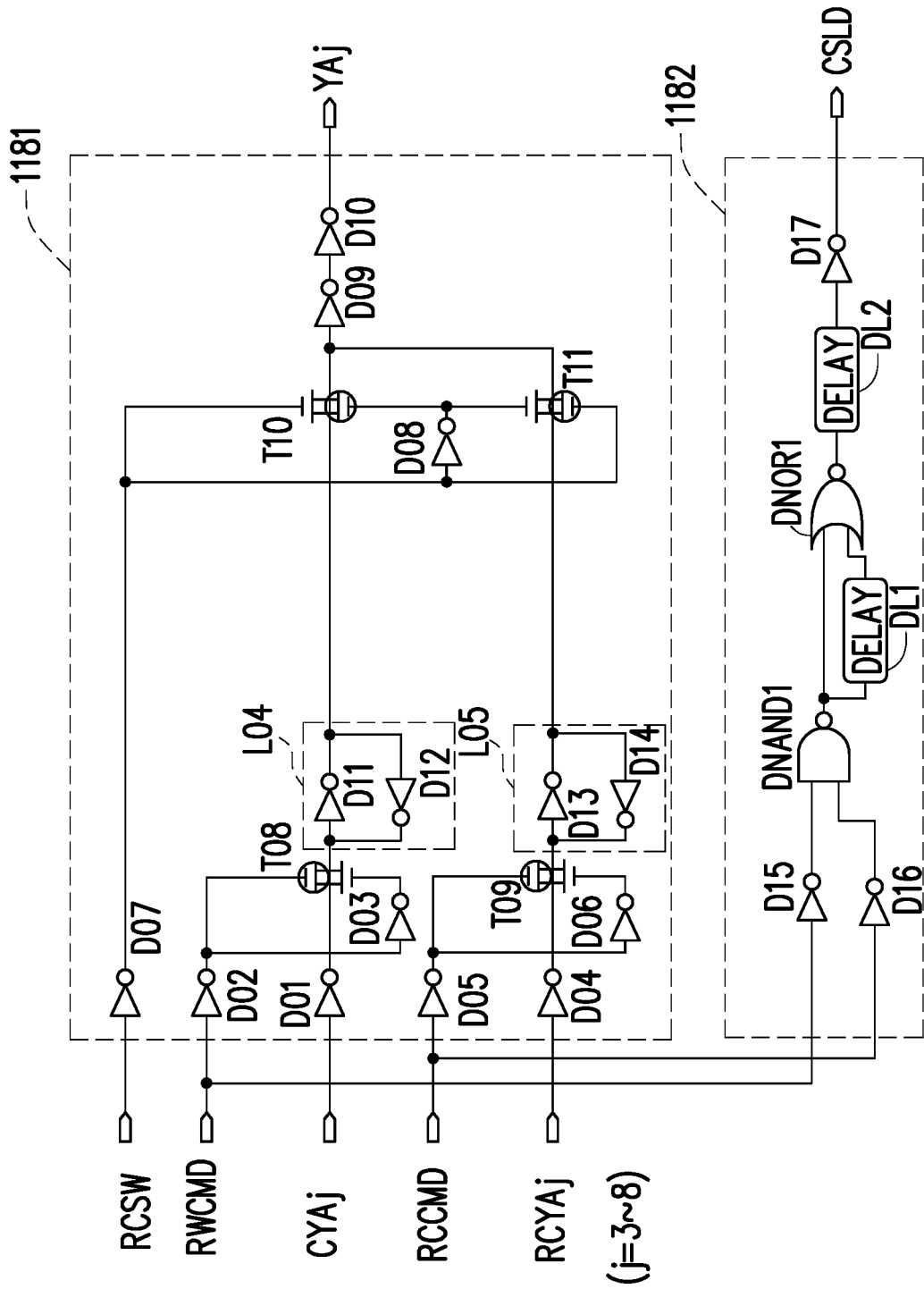
FIG. 6 is a schematic diagram of a column address signal generating circuit in an embodiment of the disclosure.

With reference to FIG. 6, the column address signal generating circuit 118 includes a column address signal buffer 1181 and a column selection driving signal generator 1182. The column address signal buffer 1181 includes inverters D01 to D10, transmission gates T08 to T11 and latch circuits L04 and L05. An input end of the inverter D01 is configured to receive the read/write column address signal CYAj. An output end of the inverter D01 is coupled to an input end of the transmission gate T08. An input end of the inverter D02 is configured to receive the read/write command RWCMD. An output end of the inverter D02 is coupled to a P-channel gate of the transmission gate T08 and an input end of the inverter D03. An output end of the inverter D03 is coupled to an N-channel gate of the transmission gate T08. An output end of the transmission gate T08 is coupled to an input end of the latch circuit L04. An input end of the inverter D04 is configured to receive the redundancy column address signal RCYAj. An output end of the inverter D04 is coupled to an input end of the transmission gate T09. An input end of the inverter D05 is configured to receive the redundancy mode command RCCMD. An output end of the inverter D05 is coupled to a P-channel gate of the transmission gate T09 and an input end of the inverter D06. An output end of the inverter D06 is coupled to an N-channel gate of the transmission gate T09. An output end of the transmission gate T09 is coupled to an input end of the latch circuit L05. An input end of the inverter D07 is configured to receive the redundancy switch signal RCSW. An output end of the inverter D07 is coupled to an N-channel gate of the transmission gate T10, an input end of the inverter D08 and a P-channel gate of the transmission gate T11. An output end of the inverter D08 is coupled to a P-channel gate of the transmission gate T010 and an N-channel gate of the transmission gate T11. An output end of the latch circuit L04 is coupled to an input end of the transmission gate T10. An output end of the latch circuit L05 is coupled to an input end of the transmission gate T11. The latch circuit L04 includes inverters D11 and D12. An input end of the inverter D11 is coupled to an output end of the inverter D12 and the output end of the transmission gate T08. An output end of the inverter D11 is coupled to an input end of the inverter D12 and the input end of the transmission gate T10. The latch circuit L05 includes inverters D13 and D14. An input end of the inverter D13 is coupled to an output end of the inverter D14 and the output end of the transmission gate T09. An output end of the inverter D13 is coupled to an input end of the inverter D14 and the input end of the transmission gate T11. Output ends of the transmission gates T10 and T11 are configured to output the column address signal YAj through the inverters DO9 and D10. In this embodiment, j is equal to 3 to 8.

In the embodiment of FIG. 6, the transmission gate T08 is controlled by the read/write command RWCMD, and the transmission gate T09 is controlled by the redundancy mode command RCCMD. When the column address signal buffer 1181 receives the read/write command RWCMD in high logic level, the column address signal buffer 1181 can latch the read/write column address signal CYAj corresponding to the read/write command RWCMD in the latch circuit L04. When the column address signal buffer 1181 receives the redundancy mode command RCCMD in high logic level, the column address signal buffer 1181 can latch the redundancy column address signal RCYAj corresponding to the redundancy mode command RCCMD in the latch circuit L05. The transmission gates T10 and T11 are controlled by the redundancy switch signal RCSW. When receiving the redundancy switch signal RCSW in low logic level, the column address signal buffer 1181 uses the read/write column address signal CYAj latched in the latch circuit L04 as the column address signal YAj, and outputs the column address signal YAj through a path from the transmission gate T10 to the inverters D09 and D10. Conversely, when receiving the redundancy switch signal RCSW in high logic level, the column address signal buffer 1181 uses the redundancy column address signal RCYAj latched in the latch circuit L05 as the column address signal YAj, and outputs the column address signal YAj through a path from the transmission gate T11 to the inverters D09 and D10.

The column selection driving signal generator 1182 is configured to receive the read/write command RWCMD and the redundancy mode command RCCMD, and thereby generate the column selection driving signal CSLD. The column selection driving signal CSLD is configured to enable the column selection control circuit 120. In this embodiment, the column selection driving signal generator 1182 includes inverters D15 to D17, a NAND gate DNAND1, delayers DL1 and DL2 and a NOR gate NOR1. An input end of the inverter D15 is configured to receive the read/write command RWCMD. An input end of the inverter D16 is configured to receive the redundancy mode command RCCMD. Output ends of the inverters D15 and D16 are coupled to a first input end and a second input end of the NAND gate DNAND1, respectively. An output end of the NAND gate DNAND1 is coupled to a first input end of the NOR gate NOR1 and an input end of the delayer DL1. An output end of the delayer DL1 is coupled to a second input end of the NOR gate NOR1. An output end of the NOR gate NOR1 is coupled to an input end of the inverter D17 through the delayer DL2. An output end of the inverter D17 is configured to output the column selection driving signal CSLD.

When at least one of the read/write command RWCMD and the redundancy mode command RCCMD is in high logic level, the column selection driving signal generator 1182 can generate the column selection driving signal CSLD in high logic level. Here, with use of the delayers DL1 and DL2, the NOR gate NOR1 and the inverter D17, a duration of the column selection driving signal CSLD in high logic level may be extended to ensure that the column selection control circuit 120 has enough enabling time.

Figure 7:
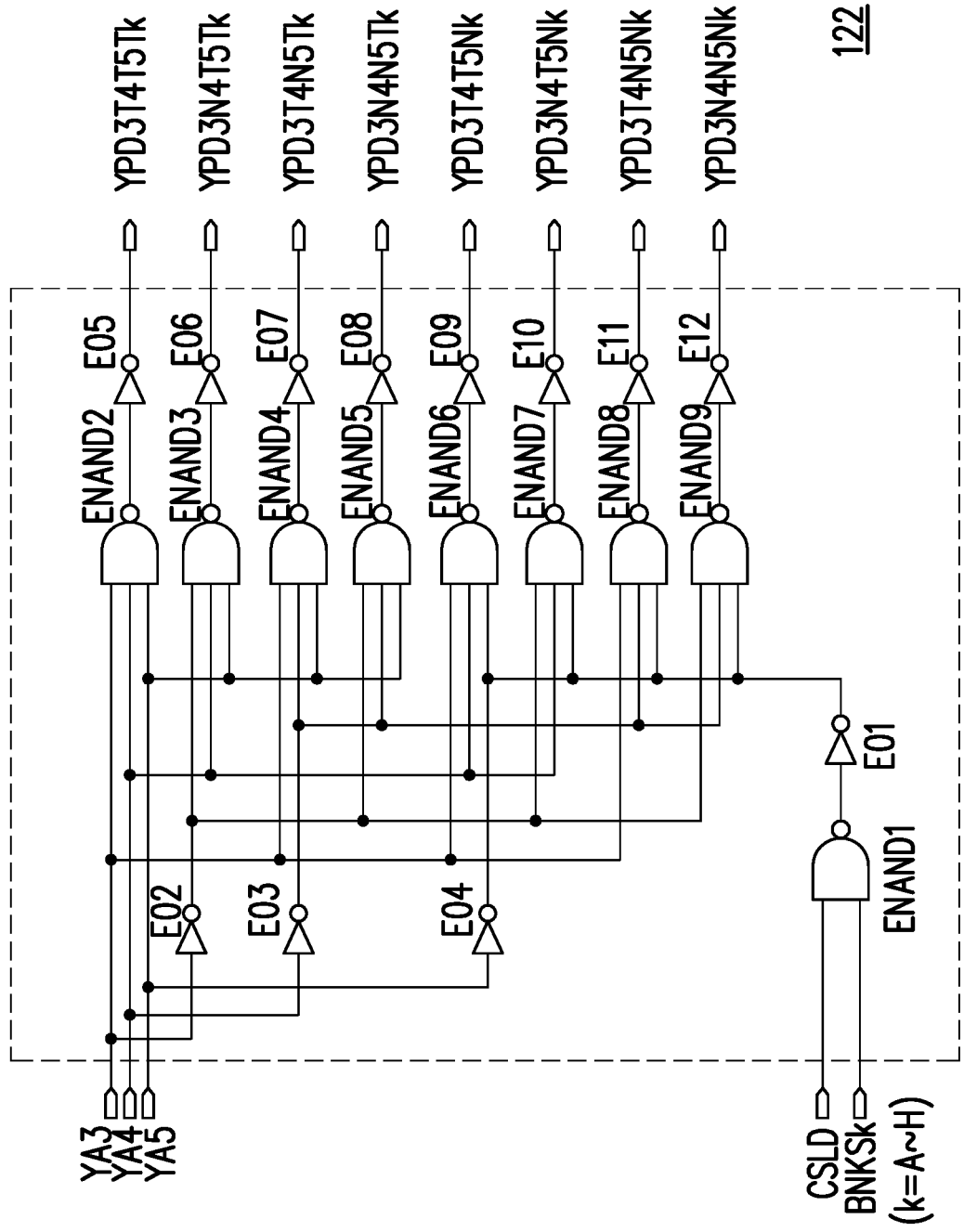
FIG. 7 is a schematic diagram of a column pre-decoder in an embodiment of the disclosure.

With reference to FIG. 7, the column pre-decoder 122 may be implemented by at least one demultiplexer. The column pre-decoder 122 includes NAND gates ENAND1 to ENAND9 and inverters E01 to E12. The NAND gate ENAND1 receives the column selection driving signal CSLD and the bank selection signal BNKSk. An output end of the NAND gate ENAND1 is coupled to an input end of an inverter E01. An output end of the inverter E01 is coupled to an input end of one of the NAND gates ENAND6 to ENAND9, so as to enable or disable the column pre-decoder 122 according to the column selection driving signal CSLD and the bank selection signal BNKSk. Input ends of the rest of the NAND gates ENAND6 to ENAND9 receive the column address signal YAj. The input end of each of the NAND gates ENAND2 to ENAND5 separately receives the column address signal YAj (e.g., column address signals YA3 to YA5). Here, the NAND gate ENAND3 receives the column address signal YA3 through the inverter E02; the NAND gate ENAND4 receives the column address signal YA4 through the inverter E03; and the NAND gate ENAND5 receives the column address signals YA3 and YA4 through the inverters E02 and E03. Output ends of the NAND gates ENAND2 to ENAND9 are coupled to input ends of the inverters E05 to E12. Output ends of the inverters E05 to E12 output pre-decoded column address signals YPD3T4T5Tk to YPD3N4N5Nk, respectively. Pre-decoded column address signals corresponding to the column address signals YA6 to YA8 may also be deduced from the above. In the embodiment, the pre-decoded column address signal YPD3N4T5Tk is the column address signal corresponding to the bank selection signal BNKSk.

Figure 8:
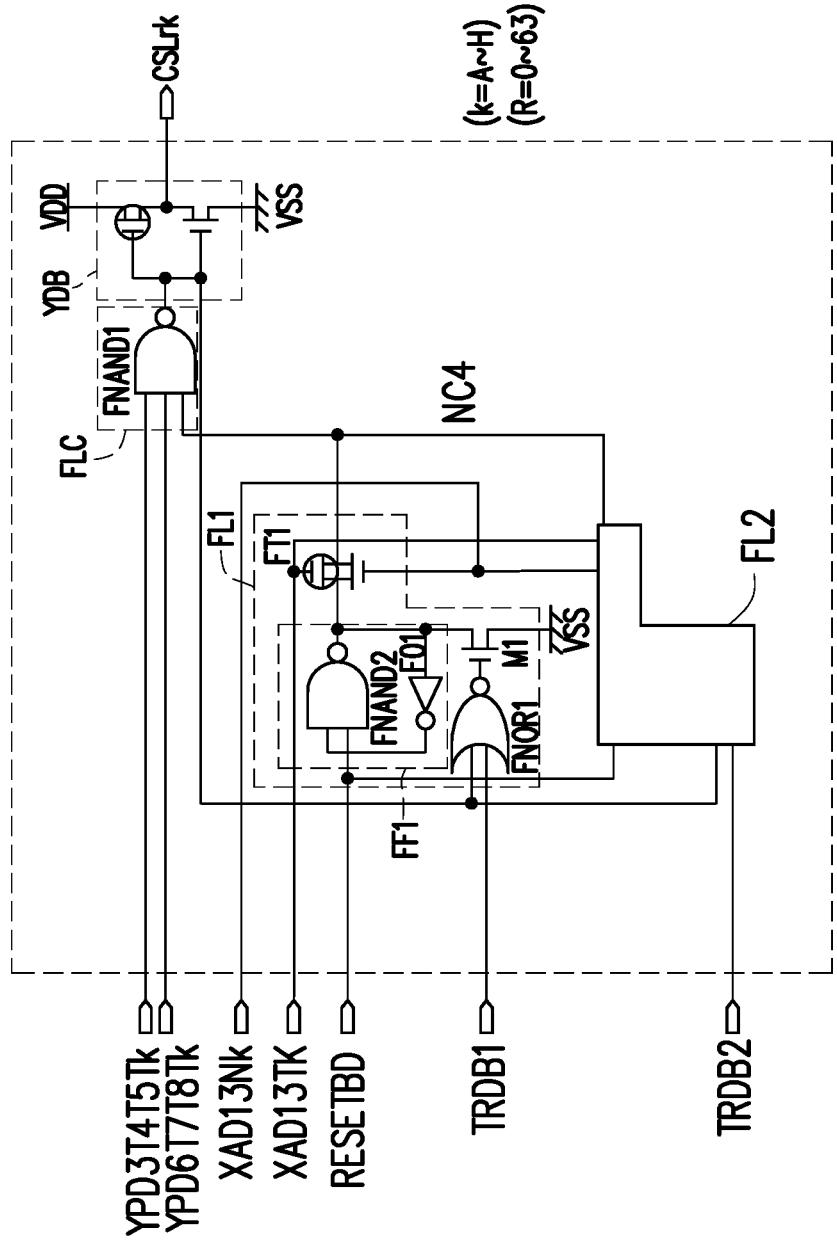
FIG. 8 is a schematic diagram of a column decoder in an embodiment of the disclosure.

With reference to FIG. 8, if the redundancy switch signal RCSW is in high logic level, the column address signal YAj received by the column decoder 124 is the redundancy column address signal. The column decoder 124 includes a column decoding logic circuit FLC, a column decoding buffer YDB and redundancy test mode data signal latch circuits FL1 and FL2. The column decoding logic circuit FLC of the embodiment may include a NAND gate FNAND1. The column decoding logic circuit FLC is configured to receive a redundancy column address signal (or the pre-decoded column address signal, such as YPD3N4T5Tk and YPD6N7T8Tk) and redundancy test mode data signal TRDB1/TRDB2 latched in the redundancy test mode data signal latch circuit FL1/FL2, and thereby perform a logic operation. The column decoding buffer YDB is coupled to an output end of the column decoding logic circuit FLC, and disables the bad column address of the main memory block 210 according to a logic operation result of the column decoding logic circuit FLC.

The redundancy test mode data signal latch circuit FL1 receives the redundancy test mode data signal TRDB1, the local reset signal RESETBD and the block selection signals XAD13Nk and XAD13Tk, and also receives the logic operation result provided by the column decoding logic circuit FLC. The redundancy test mode data signal latch circuit FL1 latches the redundancy test mode data signal TRDB1 according to the local reset signal RESETBD and the logic operation result, and outputs the latched redundancy test mode data signal TRDB1 to the column decoding logic circuit FLC according to the block selection signals XAD13Nk and XAD13Tk. The redundancy test mode data signal latch circuit FL2 receives the redundancy test mode data signal TRDB2, the local reset signal RESETBD and the block selection signals XAD13Nk and XAD13Tk, and also receives the logic operation result provided by the column decoding logic circuit FLC. The redundancy test mode data signal latch circuit FL2 latches the redundancy test mode data signal TRDB2 according to the local reset signal RESETBD and the logic operation result, and outputs the latched redundancy test mode data signal TRDB2 to the column decoding logic circuit FLC according to the block selection signals XAD13Nk and XAD13Tk. The number of the redundancy test mode data signal latch circuits in the disclosure depends on the number of blocks divided for each bank in the main memory block. The number of the redundancy test mode data signal latch circuits in the disclosure may be adjusted according to the number of blocks, rather than being limited by this embodiment.

With the redundancy test mode data signal latch circuit FL1 taken as an example, the redundancy test mode data signal latch circuit FL1 includes a flip-flop circuit FF1, a NOR gate FNOR1, a transistor M1 and a transmission gate FT1. The flip-flop circuit FF1 receives the local reset signal RESETBD and thereby initializes the flip-flop circuit FF1. A first input end of the NOR gate FNOR1 is coupled to an output end of the column decoding logic circuit FLC. A second input end of the NOR gate FNOR1 receives the redundancy test mode data signal TRDB1. In the embodiment, the flip-flop circuit FF1 includes a NAND gate FNAND2 and an inverter FO 1. A first input end of the NAND gate FNAND2 receives the local reset signal RESETBD, and an output end of the NAND gate FNAND2 is coupled to an input end of the transmission gate FT1 and a first end of the transistor M1. An input end of the inverter F01 is coupled to an output end of the NAND gate FNAND2, and an output end of the inverter F01 is coupled to a second input end of the NAND gate FNAND2. A control end of the transistor M1 is coupled to an output end of the NOR gate FNOR1; the first end of the transistor M1 is coupled to an output end of the flip-flop circuit FF1; and a second end of the transistor M1 is coupled to a reference voltage VSS.

The transmission gate FT1 is controlled by the block selection signals XAD13Nk and XAD13Tk; an input end of the transmission gate FT1 is coupled to an output end of the flip-flop circuit FF1; and an output end of the transmission gate FT1 is coupled to an input end of the column decoding logic circuit FLC and outputs the latched redundancy test mode data signal TRDB1 to the column decoding logic circuit FLC according to the block selection signals XAD13Nk and XAD13Tk. In this embodiment, a P-channel gate of the transmission gate FT1 is configured to receive the block selection signal XAD13Tk, and an N-channel gate of the transmission gate FT1 is configured to receive the block selection signal XAD13Nk. Therefore, when the N-channel gate of the transmission gate FT1 receives the block selection signal XAD13Nk in high logic level, the P-channel gate of the transmission gate FT1 receives the block selection signal XAD13Tk in low logic level and output the latched redundancy test mode data signal TRDB1 to the column decoding logic circuit FLC. Conversely, when the N-channel gate of the transmission gate FT1 receives the block selection signal XAD13Nk in low logic level, the transmission gate FT1 does not output the latched redundancy test mode data signal TRDB1.

Specifically, when the local reset signal RESETBD is in low logic level, the output end of the flip-flop circuit FF1 is maintained at high logic level, and regarded as in the state before the redundancy column operation. When the local reset signal RESETBD is transitioned (i.e., transitioned from low logic level to high logic level), the flip-flop circuit FF1 can determine whether to latch the redundancy test mode data signal TRDB1 or not according to the logic level of the redundancy test mode data signal TRDB1 and the received column address signal YAj. When the redundancy test mode data signal TRDB1 is in low logic level, it means that the column address signal YAj corresponding to the redundancy test mode data signal TRDB1 is determined as a bad column address signal during the test. In response to receiving the redundancy test mode data signal TRDB1 in low logic level and the bad column address, the NOR gate FNOR1 outputs a high logic level result to turn on the transistor M1, so as to pull down a voltage at the output end of the flip-flop circuit FF1 to the reference voltage VSS. The column decoding buffer YDB performs an inverse operation on the logic operation result of the decoding logic circuit FLC so as to provide a signal in low logic level. Accordingly, the column decoder 124 does not output the bad column address signal through the column decoding buffer YDB and the column decoding logic circuit FLC and thus the bad column address of the main memory block 210 is disabled. In other words, the column decoder 124 does not provide the bad column address of the main memory block 210 to be a column address for data access. Conversely, when the redundancy test mode data signal TRDB1 is in high logic level, the transistor M1 is turned off. In this case, the voltage at the output end of the flip-flop circuit FF1 is not pulled down to the reference voltage VSS such that the corresponding column address CSLrk is provided. On the other hand, when the local reset signal RESETBD is pulled down from high logic level to low logic level again, the logic level at the output end of the redundancy test mode data signal latch circuit FL1 is reset back to high logic level.

Here, it is worth noting that, because a layout area of the redundancy test mode data signal latch circuit FL1 may be smaller than that of the metal fuse, a layout area of the memory peripheral circuit may be effectively reduced by replacing the metal fuse with the redundancy test mode data signal latch circuit FL1. Further, by pulling down the local reset signal RESETBD from high logic level to low logic level, the redundancy test mode data signal latch circuit FL1 may be reset and restored to the state before the bad column address is disabled.

Figure 9:
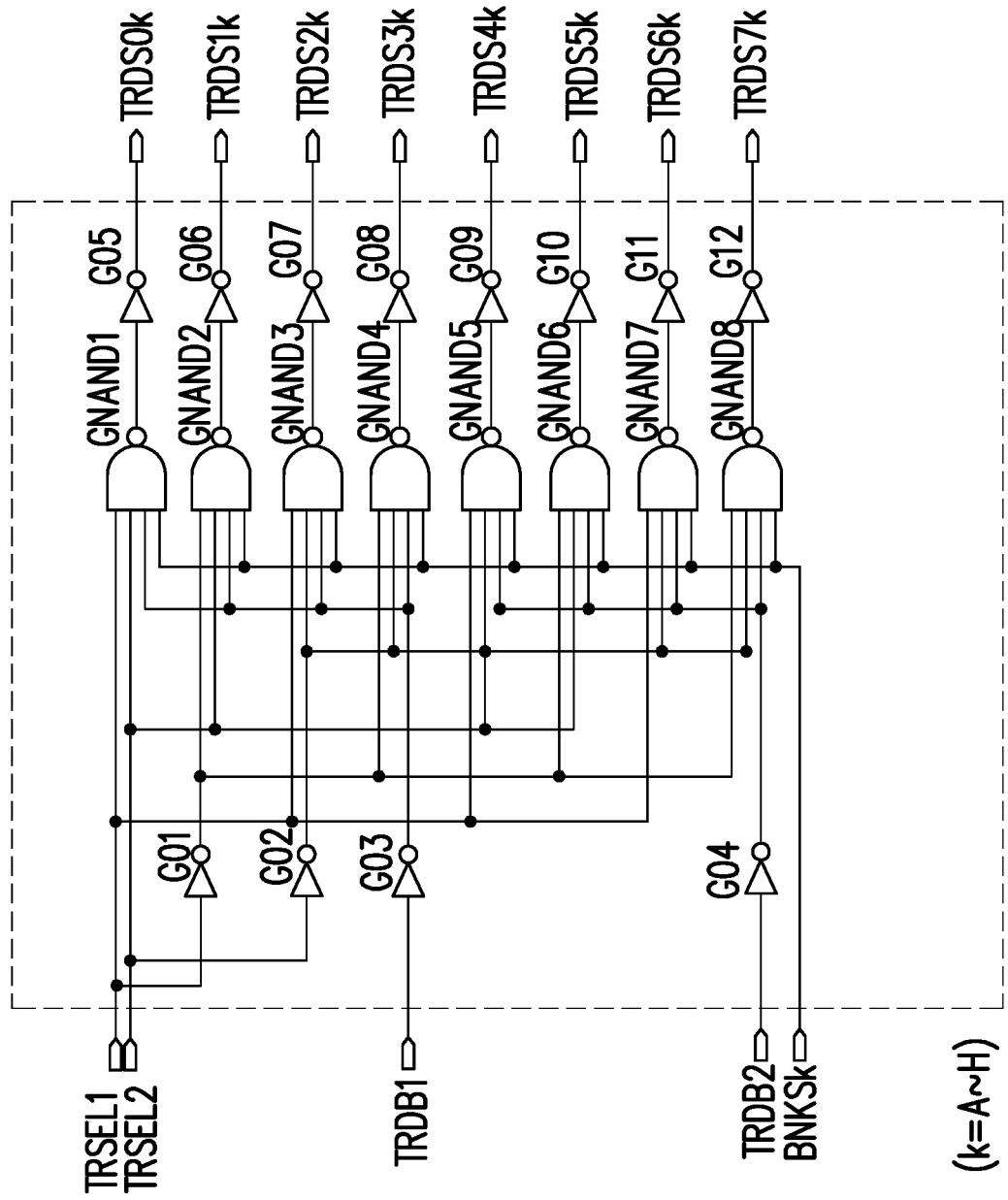
FIG. 9 is a schematic diagram of a redundancy column selection signal generator in an embodiment of the disclosure.

With reference to FIG. 2 and FIG. 9, the redundancy column decoder 126 further includes a redundancy column selection signal generator 1262. Here, the redundancy column selection signal generator 1262 may be implemented by a demultiplexer. The redundancy column selection signal generator 1262 includes inverters G01 to G12 and NAND gates GNAND1 to GNAND8. The inverter G01 receives and then outputs a redundancy column selection signal TRSEL1 to the NAND gates GNAND2, GNAND4, GNAND6 and GNAND8. The inverter G02 receives and then outputs a redundancy column selection signal TRSEL2 to the NAND gates GNAND3 to GNAND5, GNAND7 and GNAND8. The inverter G03 receives and then outputs the redundancy test mode data signal TRDB1 to the NAND gates GNAND1 to GNAND4. The inverter G04 receives and then outputs the redundancy test mode data signal TRDB2 to the NAND gates GNAND5 to GNAND8. The NAND gates GNAND1 to GNAND8 receive the redundancy column selection signals TRSEL1 and TRSEL2 directly or indirectly (through the inverters G01 and G02). The NAND gates GNAND1 to GNAND8 further receive the bank selection signal BNKSk. Output ends of the NAND gates GNAND1 to GNAND8 are coupled to input ends of the inverters G05 to G12, respectively. Output ends of the inverters G05 to G12 output redundancy column selection signals TRDS0k to TRDS7k, respectively. That is to say, in the embodiment, the redundancy column selection signal generator 1262 can provide the redundancy column selection signals TRDS0k to TRDS3k according to the redundancy column selection signals TRSEL1 and TRSEL2, the bank selection signal BNKSk and the redundancy test mode data signal TRDB1. Similarly, the redundancy column selection signal generator 1262 can also provide the redundancy column selection signals TRDS4k to TRDS7k according to the redundancy column selection signals TRSEL1 and TRSEL2, the bank selection signal BNKSk and the redundancy test mode data signal TRDB2.

Figure 10:
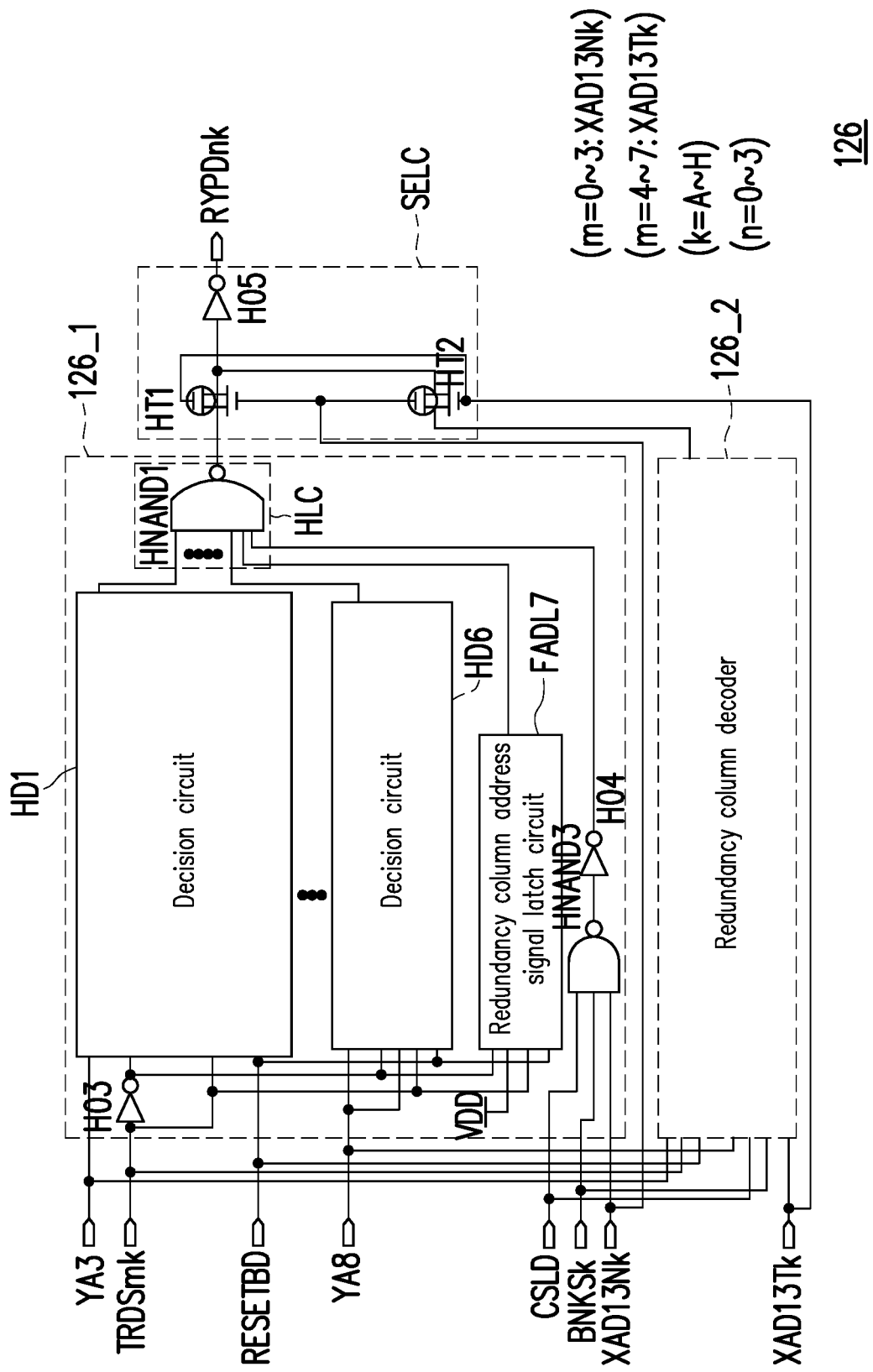
FIG. 10 is a schematic diagram of a redundancy column decoder in an embodiment of the disclosure.

With reference to FIG. 10, based on each bank being divided into two blocks in the main memory block 210 and the redundancy memory block 220, two redundancy column decoders 126_1 and 126_2 are disposed. With the redundancy column decoder 126_1 taken as an example, the redundancy column decoder 126_1 includes decision circuits HD1 to HD6 and a redundancy column decoding logic circuit HLC. Each of the decision circuits HD1 to HD6 is configured to receive a redundancy column selection signal TRDSmk, the local reset signal RESETBD and the column address signals YA3 to YA8. With the decision circuit HD1 taken as an example, the decision circuit HD1 may use the corresponding column address signal YA3 as the redundancy column address signal according to the redundancy column selection signal TRDSmk and latch the redundancy column address signal, and may be configured to provide a comparison result of the column address signal YA3 and the redundancy column address signal to the redundancy column decoding logic circuit HLC. The redundancy column decoding logic circuit HLC enables the redundancy column address RCSLnk of the redundancy memory block 220 corresponding to the redundancy column address signal according to the comparison results provided by the decision circuits HD1 to HD6.

Figure 11:
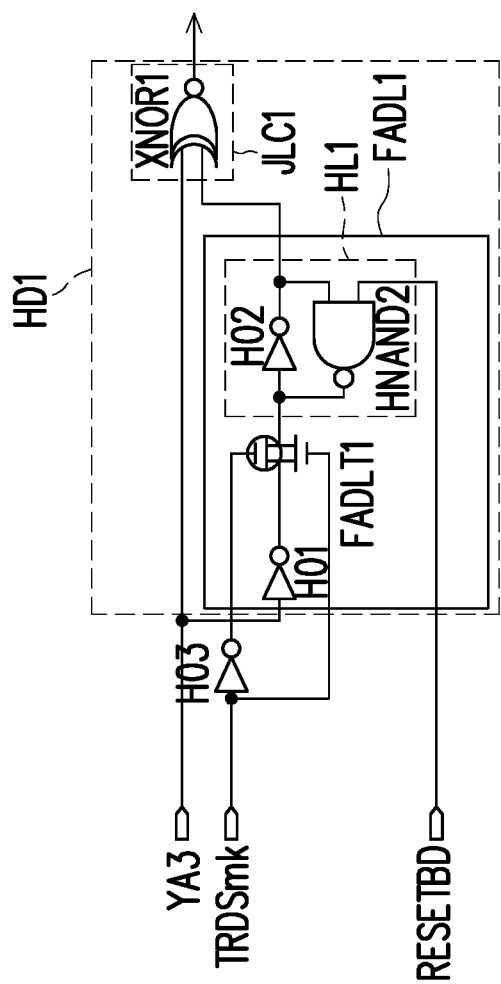
FIG. 11 is a schematic diagram of a decision circuit according to an embodiment of the disclosure.

Circuit architectures of the decision circuits HD1 to HD6 are further described below. With reference to FIG. 11 in which the decision circuit HD1 is taken as an example, the decision circuit HD1 includes a redundancy column address signal latch circuit FADL1 and a judgment logic circuit JLC1. The redundancy column address signal latch circuit FADL1 is configured to use the corresponding column address signal YA3 as the redundancy column address signal according to the redundancy column selection signal TRDSmk and latch the redundancy column address signal. A first input end of the judgment logic circuit JLC1 is configured to receive the column address signal YA3; a second input end of the judgment logic circuit JLC1 is coupled to the redundancy column address signal latch circuit FADL1; and an output end of the judgment logic circuit JLC1 is coupled to one input end of the redundancy column decoding logic circuit HLC. When the judgment logic circuit JLC1 receives the column address signal YA3, the judgment logic circuit JLC1 can determine whether the column address signal YA3 is equal to the redundancy column address signal latched in the redundancy column address signal latch circuit FADL1 and provide a corresponding determination result. For instance, the judgment logic circuit JLC1 may be an XNOR gate XNOR1. When the judgment logic circuit JLC1 determines that the column address signal YA3 is identical to the redundancy column address signal, the provided determination result is a signal in high logic level. Conversely, when the judgment logic circuit JLC1 determines that the column address signal YA3 is different from the redundancy column address signal, the provided determination result is a signal in low logic level.

The redundancy column address signal latch circuit FADL1 includes inverters HO1 and HO2, a transmission gate FADLT1 and a flip-flop circuit HF1. An input end of the inverter HO1 is configured to receive the column address signal YA3. An input end of the transmission gate FADLT1 is coupled to an output end of the inverter HO1, so as to receive the column address signal YA3 through the inverter HO1. A P-channel gate of the transmission gate FADLT1 is configured to receive the redundancy column selection signal TRDSmk through an inverter H03, and an N-channel gate of the transmission gate FADLT1 is configured to receive the redundancy column selection signal TRDSmk. The flip-flop circuit HF1 is coupled between the transmission gate FADLT1 and the judgment logic circuit JLC1. The transmission gate FADLT1 stops transmitting the column address signal YA3 to the flip-flop circuit HF1 according to the redundancy column selection signal TRDSmk in low logic level. Alternatively, the transmission gate FADLT1 transmits the column address signal YA3 corresponding to the redundancy column selection signal TRDSmk to the flip-flop circuit HF1 according to the redundancy column selection signal TRDSmk in high logic level (the column address signal YA3 is the redundancy column address signal in this case) such that the flip-flop circuit HF1 latches the redundancy column address signal. The flip-flop circuit HF1 is further configured to receive the local reset signal RESETBD, and reset or initialize the flip-flop circuit HF1 according to the local reset signal RESETBD.

The other decision circuits (e.g., HD2 to HD6) have the similar circuit architecture as the decision circuit HD1. Unlike the decision circuit HD1, the decision circuit HD2 is configured to receive the column address signal YA4; the decision circuit HD3 is configured to receive the column address signal YA5; and so on and so forth.

With reference to FIG. 10, the redundancy column decoder 126_1 may further include an enable signal generating circuit. In this embodiment, the enable signal generating circuit may be implemented by a NAND gate HNAND3 and an inverter H04. The NAND gate HNAND3 is configured to receive the column selection driving signal CSLD, the bank selection signal BNKSk and the block selection signal XAD13Nk. The enable signal generating circuit can provide an enable signal to the redundancy column decoding logic circuit HLC according to the column selection driving signal CSLD, the bank selection signal BNKSk and the block selection signal XAD13Nk. The enable signal generating circuit may also additionally include a redundancy column address signal latch circuit FADL7. Unlike the redundancy column address signal latch circuit FADL1, the redundancy column address signal latch circuit FADL7 does not receive the column address signal YAj but receives a system voltage VDD. The enable signal generating circuit can provide another enable signal to the redundancy column decoding logic circuit HLC according to the redundancy column selection signal TRDSmk.

The redundancy column decoder 126_2 has the similar designed as the redundancy column decoder 126_1. The difference between the redundancy column decoder 126_2 and the redundancy column decoder 126_1 is that, an enable signal generating circuit of the redundancy column decoder 126_2 provides an enable signal to the redundancy column decoding logic circuit HLC according to the column selection driving signal CSLD, the bank selection signal BNKSk and the block selection signal XAD13Tk.

The redundancy column decoders 126_1 and 126_2 provide the comparison results to a selector SELC. The selector SELC of the embodiment includes transmission gates HT1 and HT2 and an inverter H05. The transmission gate HT1 is coupled between the redundancy column decoder 126_1 and the inverter H05. The transmission gate HT2 is coupled between the redundancy column decoder 126_2 and the inverter H05. The transmission gate HT1 can receive the block selection signal XAD13Nk in high logic level and the block selection signal XAD13Tk in low logic level, so as to transmit the comparison result provided from the redundancy column decoder 126_1. The transmission gate HT2 can receive the block selection signal XAD13Nk in low logic level and the block selection signal XAD13Tk in high logic level, so as to transmit the comparison result provided from the redundancy column decoder 126_2. The inverter H05 is configured to output the comparison result provided by the redundancy column decoder 126_1/126_2. In other words, the selector SELC selects the comparison result provided by the redundancy column decoder 126_1/126_2 according to the block selection signals XAD13Nk and XAD13Tk. In this embodiment, the comparison result is a decoded redundancy column address signal RYPDnk.

Figure 12:
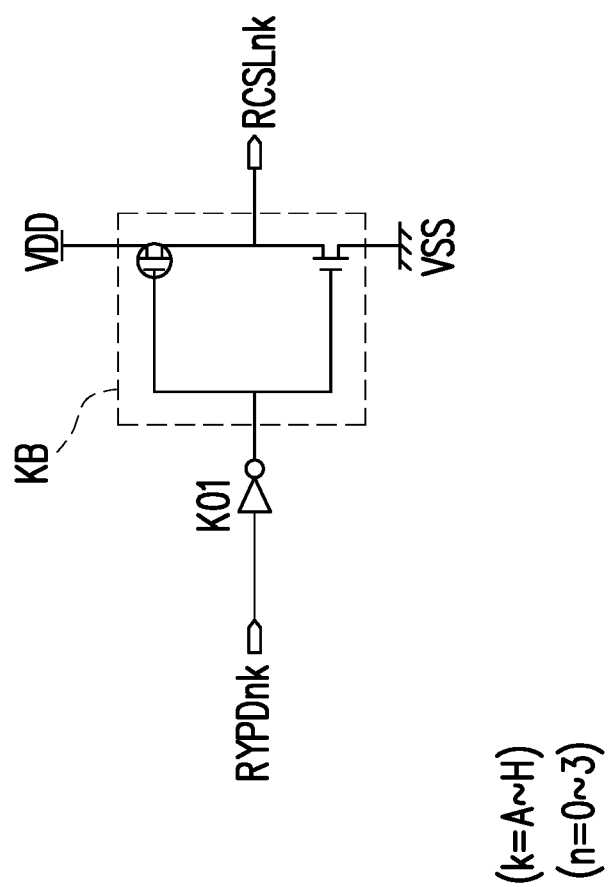
FIG. 12 is a schematic diagram of a redundancy column post-decoder in an embodiment of the disclosure.

With reference to FIG. 12, the redundancy column post-decoder 128 includes an inverter KO1 and a buffer KB. The redundancy column post-decoder 128 is configured to select the redundancy column address RCSLnk corresponding to the decoded redundancy column address signal RYPDnk according to the decoded redundancy column address signal RYPDnk.

Figure 13:
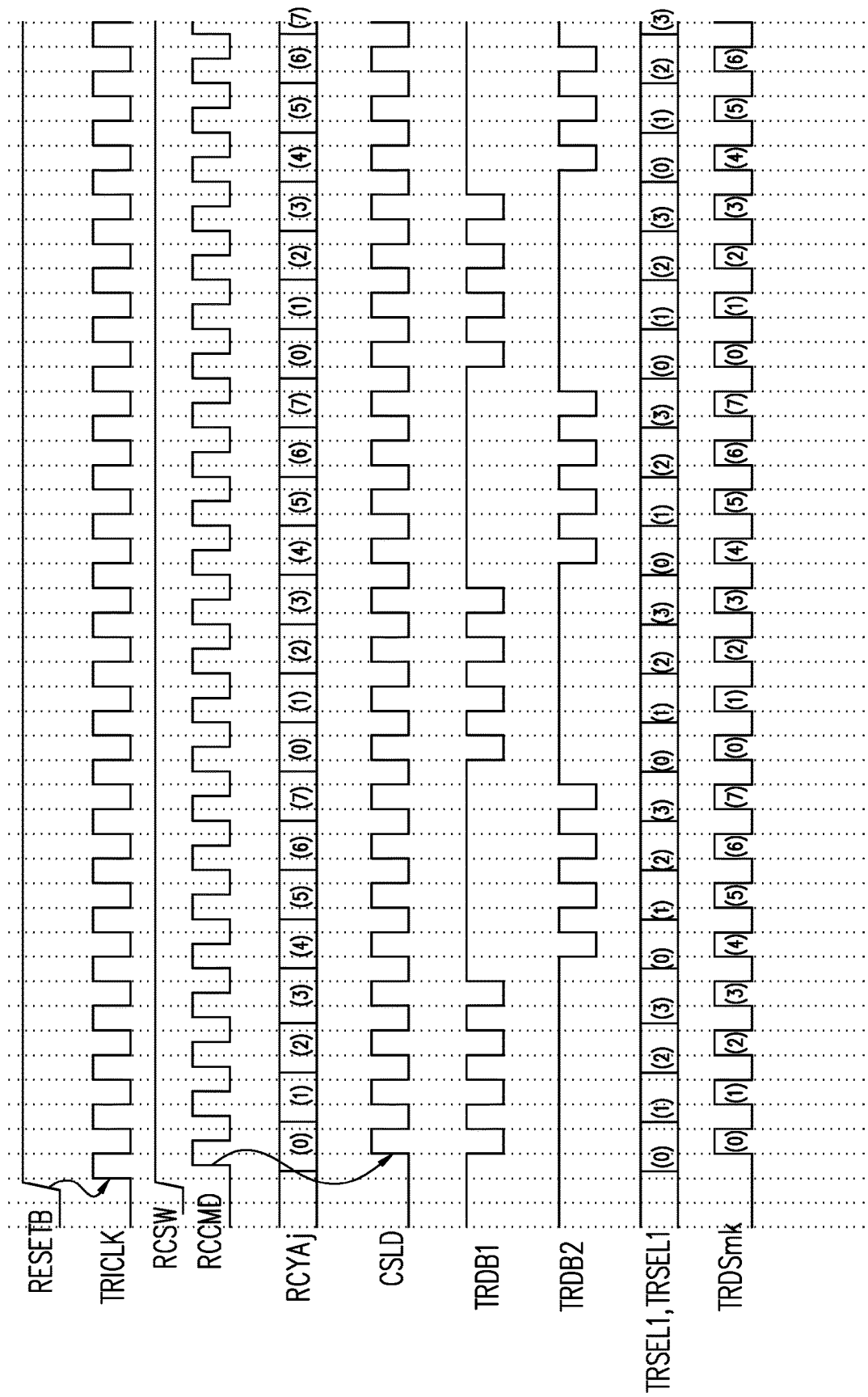
FIG. 13 is a timing chart of a redundancy column operation in an embodiment of the disclosure.

Referring to FIG. 2 and FIG. 13 together, in this embodiment, when the global reset signal RESETB is transitioned from low logic level to high logic level, the redundancy test clock TRICLK, the redundancy switch signal RCSW and the redundancy mode command RCCMD are also started to be generated. When the redundancy switch signal RSCW and the redundancy mode command RCCMD are in high logic level, the column address signal received by the column selection control circuit 120 is the redundancy column address signal, and the column selection driving signal CSLD is pulled up to high logic level. When the column selection driving signal CSLD is pulled up to high logic level and one of the redundancy test mode data signals TRDB1 and TRDB2 is in low logic level, the column decoder 124 disables the bad column address in the main memory block 210 according to the redundancy column address signal RCYAj and the redundancy test mode data signals TRDB1 and TRDB2, where j is equal to 0 to 7. In addition, the redundancy column decoder 126 also provides the redundancy column selection signal TRDSmk according to the redundancy test mode data signal TRDB1/TRDB2 and the redundancy column selection signals TRSEL1 and TRSEL2, and latch the redundancy column address signal RCYAj by the redundancy column selection signal TRDSmk. The redundancy column decoder 126 compares the column address signal YAj with the latched redundancy column address signal RCYAj to obtain a comparison result, and enables the redundancy column address RCSLnk of the redundancy memory block 220 according to the comparison result.

In summary, the memory peripheral circuit of the disclosure disables the bad column address of the main memory block according to the redundancy test mode data signal and the column address signal and enables the redundancy column address of the redundancy memory block. By replacing the decoder and the metal fuse with the memory peripheral circuit of the disclosure, the layout space may be reduced for the peripheral circuit and the state before the redundancy column operation may be rapidly restored.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A memory peripheral circuit, coupled to a memory array, the memory peripheral circuit comprising:
a redundancy column data circuit, configured to store redundancy column information and provide a redundancy test mode data signal and a column address signal according to the redundancy column information, wherein the column address signal comprises a redundancy column address signal; and a column selection control circuit, coupled between the redundancy column data circuit and the memory array, and configured to receive the redundancy test mode data signal and the column address signal, wherein the column selection control circuit comprises:
- a column decoder, coupled between a main memory block of the memory array and the redundancy column data circuit, and configured to disable a bad column address of the main memory block according to the redundancy test mode data signal and the redundancy column address signal; and
- a redundancy column decoder, coupled between a redundancy memory block of the memory array and the redundancy column data circuit, and configured to latch the redundancy column address signal according to the redundancy test mode data signal, compare the column address signal with the latched redundancy column address signal to obtain a comparison result and enable a redundancy column address of the redundancy memory block according to the comparison result.

2. The memory peripheral circuit according to claim 1, wherein
the redundancy column data circuit is further configured to provide a local reset signal, and
the redundancy column data circuit resets the column decoder and the redundancy column decoder according to a first logic level of the local reset signal and initializes the column decoder and the redundancy column decoder according to a transition point of the local reset signal.

3. The memory peripheral circuit according to claim 2, wherein the column decoder comprises:
a column decoding logic circuit, configured to receive the redundancy column address signal and the latched redundancy test mode data signal and obtain a logic operation result according to the redundancy column address signal and the latched redundancy test mode data signal;
a column decoding buffer, coupled to an output end of the column decoding logic circuit, and configured to disable the bad column address of the main memory block according to the logic operation result; and
a redundancy test mode data signal latch circuit, configured to receive the logic operation result, the redundancy test mode data signal, the local reset signal and a block selection signal, latch the redundancy test mode data signal according to the local reset signal and the logic operation result, and output the latched redundancy test mode data signal to the column decoding logic circuit according to the block selection signal.

4. The memory peripheral circuit according to claim 3, wherein the redundancy test mode data signal latch circuit comprises:
a flip-flop circuit, configured to latch the redundancy test mode data signal and receive the local reset signal to be reset or initialized according to the local reset signal;
a NOR gate, a first input end of the NOR gate being coupled to an output end of the column decoding logic circuit, a second input end of the NOR gate receiving the redundancy test mode data signal;
a transistor, a control end of the transistor being coupled to an output end of the NOR gate, a first end of the transistor being coupled to an output end of the flip-flop circuit, a second end of the transistor being coupled to a reference voltage; and a transmission gate, an input end of the transmission gate being coupled to the output end of the flip-flop circuit and controlled by the block selection signal, an output end of the transmission gate being coupled to an input end of the column decoding logic circuit and transmitting the latched redundancy test mode data signal according to the block selection signal.

5. The memory peripheral circuit according to claim 4, wherein the flip-flop circuit comprises:
a NAND gate, a first input end of the NAND gate receiving the local reset signal, an output end of the NAND gate being coupled to the input end of the transmission gate and the first end of the transistor; and
an inverter, an input end of the inverter being coupled to the output end of the NAND gate, an output end of the inverter being coupled to a second input end of the NAND gate.

6. The memory peripheral circuit according to claim 1, wherein
the redundancy column data circuit is further configured to provide a redundancy column selection signal,
the redundancy column decoder further comprises:
a redundancy column selection signal generator, coupled between the redundancy column data circuit and the redundancy column decoder, and configured to provide the redundancy column selection signal to the redundancy column decoder according to the redundancy test mode data signal and the redundancy column selection signal.

7. The memory peripheral circuit according to claim 6, wherein the redundancy column decoder further comprises:
at least one decision circuit, the at least one decision circuit being configured to receive the redundancy column selection signal, the local reset signal and the redundancy column address signal, use the corresponding column address signal as the redundancy column address signal according to the redundancy column selection signal, latch the redundancy column address signal and compare the column address signal with the redundancy column address signal to provide the comparison result; and
a redundancy column decoding logic circuit, configured to receive the comparison result provided by the at least one decision circuit and enable the redundancy column address of the redundancy memory block corresponding to the redundancy column address signal according to the comparison result.

8. The memory peripheral circuit according to claim 7, wherein each of the at least one decision circuit comprises:
a redundancy column address signal latch circuit, configured to use the corresponding column address signal as the redundancy column address signal according to the redundancy column selection signal and latch the redundancy column address signal; and
a judgment logic circuit, a first input end of the judgment logic circuit being configured to receive the column address signal, a second input end of the judgment logic circuit being coupled to the redundancy column address signal latch circuit, an output end of the judgment logic circuit being coupled to an input end of the redundancy column decoding logic circuit.

9. The memory peripheral circuit according to claim 8, wherein the redundancy column address signal latch circuit comprises:
an inverter, an input end of the inverter receiving the column address signal;

a transmission gate, an input end of the transmission gate being coupled to an output end of the inverter, and configured to be controlled by the redundancy column selection signal and transmit the latched redundancy test mode data signal according to the block selection signal; and a flip-flop circuit, coupled between the transmission gate and the judgment logic circuit, and configured to latch the redundancy column address signal and receive the local reset signal to be reset or initialized according to the local reset signal.

10. The memory peripheral circuit according to claim 2, wherein the redundancy column data circuit is further configured to provide a redundancy column selection signal, the redundancy column decoder further comprises:

a redundancy column selection signal generator, coupled between the redundancy column data circuit and the redundancy column decoder, and configured to provide the redundancy column selection signal to the redundancy column decoder according to the redundancy test mode data signal and the redundancy column selection signal.

11. A memory device, comprising:

a memory array, the memory array comprising a main memory block and a redundancy memory block; and the memory peripheral circuit according to claim 1.

12. The memory device according to claim 11, wherein the redundancy column data circuit is further configured to provide a local reset signal, and the redundancy column data circuit resets the column decoder and the redundancy column decoder according to a first logic level of the local reset signal and initializes the column decoder and the redundancy column decoder according to a transition point of the local reset signal.

13. The memory device according to claim 12, wherein the column decoder comprises:

a column decoding logic circuit, configured to receive the redundancy column address signal and the latched redundancy test mode data signal and obtain a logic operation result according to the redundancy column address signal and the latched redundancy test mode data signal;

a column decoding buffer, coupled to an output end of the column decoding logic circuit, and configured to disable the bad column address of the main memory block according to the logic operation result; and a redundancy test mode data signal latch circuit, configured to receive the logic operation result, the redundancy test mode data signal, the local reset signal and a block selection signal, latch the redundancy test mode data signal according to the local reset signal and the logic operation result, and output the latched redundancy test mode data signal to the column decoding logic circuit according to the block selection signal.

14. The memory device according to claim 13, wherein the redundancy test mode data signal latch circuit comprises:

a flip-flop circuit, configured to latch the redundancy test mode data signal and receive the local reset signal to be reset or initialized according to the local reset signal;

a NOR gate, a first input end of the NOR gate being coupled to an output end of the column decoding logic circuit, a second input end of the NOR gate receiving the redundancy test mode data signal;

a transistor, a control end of the transistor being coupled to an output end of the NOR gate, a first end of the transistor being coupled to an output end of the flip-flop circuit, a second end of the transistor being coupled to a reference voltage; and a transmission gate, an input end of the transmission gate being coupled to the output end of the flip-flop circuit and controlled by the block selection signal, an output end of the transmission gate being coupled to an input end of the column decoding logic circuit and transmitting the latched redundancy test mode data signal according to the block selection signal.

15. The memory device according to claim 14, wherein the flip-flop circuit comprises:

a NAND gate, a first input end of the NAND gate receiving the local reset signal, an output end of the NAND gate being coupled to the input end of the transmission gate and the first end of the transistor; and an inverter, an input end of the inverter being coupled to the output end of the NAND gate, an output end of the inverter being coupled to a second input end of the NAND gate.

16. The memory device according to claim 11, wherein the redundancy column data circuit is further configured to provide a redundancy column selection signal, the redundancy column decoder further comprises:

a redundancy column selection signal generator, coupled between the redundancy column data circuit and the redundancy column decoder, and configured to provide the redundancy column selection signal to the redundancy column decoder according to the redundancy test mode data signal and the redundancy column selection signal.

17. The memory device according to claim 16, wherein the redundancy column decoder further comprises:

at least one decision circuit, the at least one decision circuit being configured to receive the redundancy column selection signal, the local reset signal and the redundancy column address signal, use the corresponding column address signal as the redundancy column address signal according to the redundancy column selection signal, latch the redundancy column address signal and compare the column address signal with the redundancy column address signal to provide the comparison result; and a redundancy column decoding logic circuit, configured to receive the comparison result provided by the at least one decision circuit and enable the redundancy column address of the redundancy memory block corresponding to the redundancy column address signal according to the comparison result.

18. The memory device according to claim 17, wherein each of the at least one decision circuit comprises:

a redundancy column address signal latch circuit, configured to use the corresponding column address signal as the redundancy column address signal according to the redundancy column selection signal and latch the redundancy column address signal; and a judgment logic circuit, a first input end of the judgment logic circuit being configured to receive the column address signal, a second input end of the judgment logic circuit being coupled to the redundancy column address signal latch circuit, an output end of the judgment logic circuit being coupled to an input end of the redundancy column decoding logic circuit.

19. The memory device according to claim 18, wherein the redundancy column address signal latch circuit comprises:

an inverter, an input end of the inverter receiving the column address signal;

a transmission gate, an input end of the transmission gate being coupled to an output end of the inverter, and configured to be controlled by the redundancy column selection signal and transmit the latched redundancy test mode data signal according to the block selection signal; and a flip-flop circuit, coupled between the transmission gate and the judgment logic circuit, and configured to latch the redundancy column address signal and receive the local reset signal to be reset or initialized according to the local reset signal.

20. The memory device according to claim 12, wherein the redundancy column data circuit is further configured to provide a redundancy column selection signal, the redundancy column decoder further comprises:

a redundancy column selection signal generator, coupled between the redundancy column data circuit and the redundancy column decoder, and configured to provide the redundancy column selection signal to the redundancy column decoder according to the redundancy test mode data signal and the redundancy column selection signal.

* * * * *